US012588335B2

(12) United States Patent
Wang et al.

(10) Patent No.: US 12,588,335 B2
(45) Date of Patent: Mar. 24, 2026

(54) LIGHT EMITTING DIODE FILAMENT INCLUDING FLIP CHIP LIGHT EMITTING DIODES TO REDUCE THE AMOUNT OF PHOSPHOR THAT IS INTEGRATED INTO THE FILAMENT

(71) Applicant: LEDVANCE LLC, Wilmington, MA (US)

(72) Inventors: Xinrong Wang, Shenzhen (CN); Tianzheng Jiang, Shenzhen (CN); Ming Li, Acton, MA (US)

(73) Assignee: LEDVANCE LLC, Wilmington, MA (US)

( * ) Notice: Subject to any disclaimer, the term of this patent is extended or adjusted under 35 U.S.C. 154(b) by 1178 days.

(21) Appl. No.: 17/517,158

(22) Filed: Nov. 2, 2021

(65) Prior Publication Data

US 2023/0134502 A1     May 4, 2023

(51) Int. Cl.
| | |
|---|---|
| *H10H 20/857* | (2025.01) |
| *H01L 25/075* | (2006.01) |
| *H10H 20/01* | (2025.01) |
| *H10H 20/825* | (2025.01) |
| *H10H 20/851* | (2025.01) |
| *H10H 20/854* | (2025.01) |

(52) U.S. Cl.
CPC ....... *H10H 20/857* (2025.01); *H01L 25/0753* (2013.01); *H10H 20/01* (2025.01); *H10H 20/825* (2025.01); *H10H 20/8512* (2025.01); *H10H 20/854* (2025.01); *H10H 20/0362* (2025.01); *H10H 20/0364* (2025.01)

(58) Field of Classification Search
CPC .... H10H 20/857; H10H 20/01; H10H 20/825; H10H 20/8512; H10H 20/854; H10H 20/0362; H01L 25/0753
See application file for complete search history.

(56) References Cited

U.S. PATENT DOCUMENTS

| | | | | |
|---|---|---|---|---|
| 2014/0367713 A1* | 12/2014 | Zhang | ........................ | F21K 9/64 |
| | | | | 257/89 |
| 2015/0349216 A1* | 12/2015 | Chiu | .................. | H10H 20/8515 |
| | | | | 257/9 |

(Continued)

OTHER PUBLICATIONS www.betterautomotivelighting.com article "What is a CSP LED Chip and how is it different from an SMD LED chip?" https://blog. betterautomotivelighting.com/what-is-a-csp-led-chip-and-how-is-it-different-from-an-smd-led-chip#:~:text=CSP%2C%20or%20Chip% 20Scale%20Package,and%20reduce%20possible%20failure% 20points.

*Primary Examiner* — Ratisha Mehta
(74) *Attorney, Agent, or Firm* — Harry Hild

(57)     ABSTRACT

A light emitting diode (LED) structure that includes a stent substrate; and a circuit having a plurality of contact pads arranged along a length of the stent substrate. The structure further includes a plurality of light emitting diode (LED) chips, wherein each light emitting diode chip in the plurality of chips is engaged to a set of contact pads along the length of the metal stent substrate. A continuous phosphor layer is present overlying the plurality of light emitting diode (LED) chips, the continuous phosphor layer including first portions that are in direct contact with at least a light transmission surface of the light emitting diode (LED) chips and second portions that bridge across the space separating adjacently positioned light emitting diode. An encapsulant present over the continuous phosphor layer that is covering at least the light emitting diode chips.

20 Claims, 3 Drawing Sheets

(56)          References Cited

U.S. PATENT DOCUMENTS

2016/0005939 A1*   1/2016   Andrews ................. H01L 24/97
                                               257/91
2017/0012182 A1*   1/2017   Cao ..................... H01L 25/0753

* cited by examiner

LIGHT EMITTING DIODE FILAMENT INCLUDING FLIP CHIP LIGHT EMITTING DIODES TO REDUCE THE AMOUNT OF PHOSPHOR THAT IS INTEGRATED INTO THE FILAMENT

TECHNICAL FIELD

The present disclosure generally relates to light engines employed in lamp assemblies, and more particularly to light engines employing light emitting diodes for the light source.

BACKGROUND

Conservation and management of electrical power are a growing concern with regard to both cost and environmental impact. In various lighting applications, the use of light emitting diodes (LEDs) for illumination is beginning to emerge as a lighting source with potential for addressing these concerns. LED light sources have a long life, are energy efficient, are durable and operate over a wide temperature range.

An LED filament light bulb is an LED lamp which is designed to resemble a traditional incandescent light bulb with visible filaments for aesthetic and light distribution purposes, but with the high efficiency of light-emitting diodes (LEDs). It produces its light using LED filaments, which are series-connected strings of diodes that resemble in appearance the filaments of incandescent light bulbs. They are direct replacements for conventional clear (or frosted) incandescent bulbs, as they are made with the same envelope shapes, the same bases that fit the same sockets, and work at the same supply voltage.

SUMMARY

In one aspect, the methods and structures of the present disclosure reduces the amount of phosphor employed in Light Emitting Diode (LED) filament.

In one embodiment, the light emitting diode (LED) filament includes a stent substrate; and a circuit having a plurality of contact pads arranged along a length of the stent substrate; and a plurality of light emitting diode (LED) chips. Each light emitting diode chip in the plurality of chips is engaged to a set of contact pads along the length of the metal stent substrate to provide that the plurality of light emitting diode (LED) chips are electrically connected in series. A continuous phosphor layer is present overlying the plurality of light emitting diode (LED) chips. The continuous phosphor layer includes first portions of the continuous phosphor layer that are in direct contact with at least a light transmission surface of the light emitting diode (LED) chips, and second portions of the continuous phosphor layer that bridge across the space separating adjacently positioned light emitting diodes. The light emitting diode (LED) filament also includes an encapsulant present over at least the light emitting diode chips.

In some embodiments, the plurality of light emitting diode (LED) chips comprise Flip Chip (FC) light emitting diodes (LEDS), and the encapsulant is transparent or translucent.

In some embodiments, the length for the LED filament ranges from 3 mm to 30 mm, and a width for the LED filament ranges from 0.3 mm to 2.0 mm.

In some embodiments, the light transmission surface of the light emitting diode (LED) chip that is in contact with the first portions of the continuous phosphor layer is an upper surface of the light emitting diode chip that is opposite the surface of the light emitting diode (LED) chip that is bonded to the stent substrate.

In some embodiments, each light emitting diode chip in the plurality of chips is engaged to the set of contact pads by solder bond.

In some embodiments, a thickness for the continuous phosphor layer ranges from 150 microns to 500 microns.

In some embodiments, the continuous phosphor layer is only present on a side of the stent substrate that the Light Emitting Diodes (LEDs) are also present on.

In another embodiment, the light emitting diode (LED) filament includes a filament substrate; and a plurality of flip chip light emitting diode (LED)s. A continuous phosphor layer is present overlying the plurality of flip chip light emitting diode (LED) chips. The continuous phosphor layer includes first portions of the continuous phosphor layer that are in direct contact with at least a light transmission surface of the light emitting diode (LED) chips, and second portions of the continuous phosphor layer that bridge across the space separating adjacently positioned light emitting diodes.

In some embodiments, the filament substrate is comprised of a dielectric material or a metal selected from the group consisting of stainless steel, copper, brass, aluminum, aluminum alloy, tungsten and combinations thereof. The encapsulant can be transparent or translucent.

In some embodiments, the plurality of light emitting diodes (LEDs) use a 385 nm to 480 nm light emitting semiconductor material structure. The plurality of light emitting diodes (LED) can include GaN (gallium nitride) light emitting diodes, indium gallium nitride (InGaN) light emitting diodes or a combination thereof.

The phosphor encapsulant can have a composition including cerium doped yttrium aluminium garnet (YAG:Ce) crystals.

In some embodiments, the continuous phosphor layer is only present on a side of the filament substrate that the Flip Chip (FC) Light Emitting Diodes (LEDs) are also present on.

In another aspect of the present disclosure, a method of assembling a filament light emitting diode is provided that includes forming a circuit on a filament stent substrate, wherein the circuit having pads arranged along of length of the filament stent substrate; and bonding light emitting diode (LED) chips to the circuit. The light emitting diode chips including a light emitting diode (LED) die having contacts on a contact surface side of the LED chips for the bonding to the pads of the printed circuit. The method further includes forming a continuous and conformal phosphor layer on the plurality of light emitting diodes, the phosphor layer includes first portions of the continuous phosphor layer that are in direct contact with at least a light transmission surface of the light emitting diode (LED) chips, and second portions of the continuous phosphor layer that bridge across the space separating adjacently positioned light emitting diodes.

The phosphor layer is only present on the side of the filament stent substrate that the Flip Chip (FC) Light Emitting Diodes (LEDs) are also present on. This is distinguished from prior methods of depositing a phosphor to encapsulate the chips to the substrate, in which the encapsulant surrounds the substrate, i.e., in present on both sides of the substrate (e.g., present on both the side of the substrate engaged to the chips and also present on the backside of the substrate where the chips are not present).

These and other features and advantages will become apparent from the following detailed description of illustrative embodiments thereof, which is to be read in connection with the accompanying drawings.

BRIEF DESCRIPTION OF THE DRAWINGS

The following description will provide details of embodiments with reference to the following figures wherein.

DETAILED DESCRIPTION

Figures 1, 2:
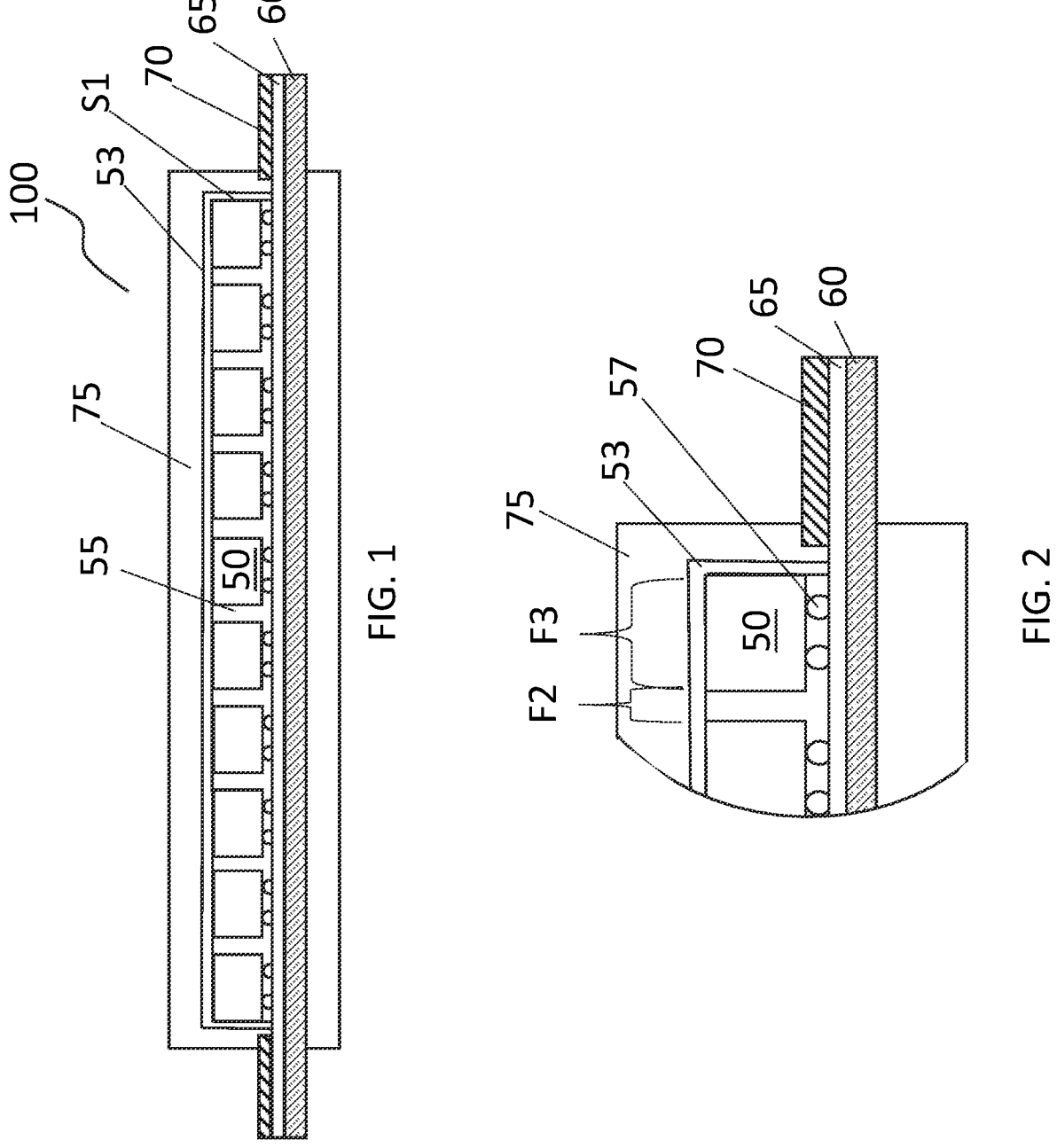
FIG. 1 is a side cross-sectional view of the filament assembly including Flip Chip (FC) Light Emitting Diode (LEDs), in accordance with one embodiment of the present disclosure.
FIG. 2 is a magnified view of Flip Chip (FC) Light Emitting Diode (LEDs) being engaged to a filament substrate depicted in FIG. 1.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

The LED filament includes multiple series-connected light emitting diodes LEDs on a transparent substrate, referred to as chip-on-glass (COG). These transparent substrates are made of ceramic or sapphire materials. This transparency allows the emitted light to disperse evenly and uniformly without any interference. An even coating of silicone resin/yellow phosphor blend material converts the blue light generated by the LEDs into light approximating white light of the desired color temperature, e.g., 2700 K to match the warm white of an incandescent bulb. The structure of these filaments generally includes an LED chip, stents or substrate, and silicon glue mixed with phosphor. The LED chips are generally stamped on led stents, and then coated with the silicon glue, which is a mixture including the yellow color phosphor powder. However, LED meeting the above description often have yellow appearance, especially when the lamp incorporating these LEDs is under a power off status. Although, the filament lamp can meet the requirement of traditional lighting requirement, the yellow color on the filament is eye-catching, and unattractive, when the lamp is off. This is especially the case when employed in light fixtures having a geometry and style for a traditional or retro-styled lighting fixture, such as crystal chandeliers.

The structures and methods of the present disclosure can provide light emitting diode (LED) filaments that look inconspicuous. The structures and methods employ a reduced amount of phosphor. The LED filaments described herein have a reduced size and employ a thin layer of phosphor. A combination of the size, geometry and thickness of the filament components related to the layer of phosphor help to provide lamp designs incorporating the filaments that do not include the highly distinctive yellow color of designs including a greater amount of phosphor. The methods and structures of the present disclosure are now described with reference to FIGS. 1-5C.

Referring to FIGS. 1-4, in some embodiments, to provide filaments 100 including a reduced phosphor content, the methods and structures begin with a filament geometry that is relatively small. For example, the length L1 can range from 3 mm to 30 mm, and the width W1 generally ranges from 0.3 mm to 2.0 mm. The diameter D1 of a filament can range from 0.6 mm to 2 mm.

In one embodiment, the light emitting diodes (LEDs) employed in the filaments 100 are flip chips (FC). Flip chip (FC) LED technology includes installing the LED chip upside down (therefore why it is called "flipped"), and directly soldering the chip to the electrical pathway for energizing the LEDs. A flip chip LED design relies upon the soldering for electrical connectivity, and there is no need for physical wiring to bring electrical signal to the energize the light generating element of the LED.

In this embodiment, using flip chip (FC) technology, the LEDs are engaged to the substrate which includes a printed electrical circuit to provide electrical communication to the LEDs. In a following step, the LED chips are covered with a thin layer of phosphor. In some embodiments, the thin layer of phosphor encapsulates the plurality of flip chip LEDs with a single continuous and conformal layer. The single continuous and conformal phosphor layer is particularly thin. For example, the thickness of the single continuous and conformal phosphor layer may range from 150 microns to 500 microns.

The single continuous and conformal thickness phosphor layer may extend across the entirely of flip chip LEDs' on a single filament substrate, e.g., filament stent, in which the single phosphor layer bridges across the space separating the adjacently positioned flip chip LED's. It is further noted, that the single continuous and conformal thickness layer for the phosphor may be present on only the side of the filament substrate (also referred to as filament stent) that the flip chip LEDs are present on.

Figures 3, 4:
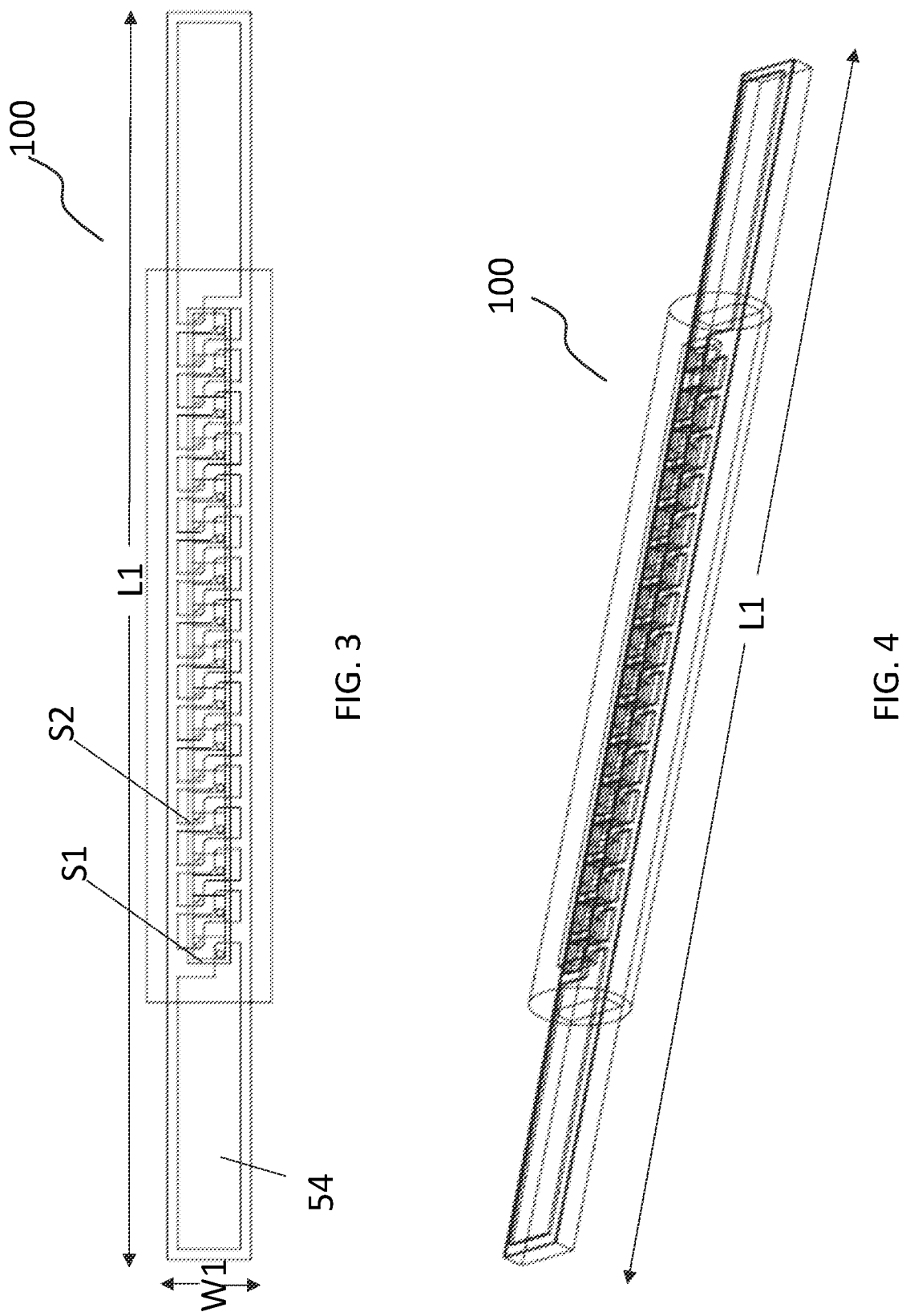
FIG. 3 is a top down view of a filament assembly including a Flip Chip (FC) Light Emitting Diode (LEDs) illustrating the printed circuit providing electrical communication to the filament assembly including at Flip Chip (FC) Light Emitting Diode (LEDs), in accordance with one embodiment of the present disclosure.
FIG. 4 is a perspective view of one embodiment of a Light Emitting Diode (LED) filament assembly including Flip Chip (FC) Light Emitting Diode (LEDs), in accordance with one embodiment of the present disclosure.

FIGS. 1-4 illustrate one embodiment of a filament structure 100 including Flip Chip (FC) light emitting diodes (LEDs) 50 as the light source (also referred to as light engine) for the filament. The filament structure 100 includes a base substrate 60 (also referred to as a stent or stent substrate). Atop the base substrate 60 is an insulating layer 65, and a conductor layer 70 may be present atop the insulating layer 65. The insulating layer 65 provides for electrical isolation of the Flip Chip (FC) light emitting diodes (LEDs) 50 and the base substrate 60. A circuit 54, e.g., printed circuit, provides for electrical communication between the Flip Chip (FC) light emitting diodes (LEDs) 50, and a conductive layer 70 that provides the electrode to the filament structure 100. The circuit 54 can be viewed in the top down perspective view that is depicted in FIG. 3.

The plurality of Flip Chip (FC) light emitting diodes (LEDs) 50 can be in electrical communication through series connection, and may be referred to as an array of Flip Chip (FC) light emitting diodes (LEDs) 50. The array of Flip Chip (FC) light emitting diodes (LEDs) 50 can be linearly disposed along the length L1 of the base substrate 60. The entire array of Flip Chip (FC) light emitting diodes (LEDs) 50 may be referred to an island.

In some embodiments, a majority of the Flip Chip (FC) light emitting diodes (LEDs) 50 are covered with a layer of phosphor. In some embodiments, the layer of phosphor extends continuously over the entire array of LEDs 50, e.g., the entire island of LEDs 50, that are present in the filament 100. For example, the layer of phosphor may be a single layer that is in direct contact with the upper surfaces of the LEDs 50, and bridges across the spaces separating the adjacent LEDs in the array. In some instances, an air gap 55 may be present under the portion of the phosphor layer 53 that bridges across the spaces separating the adjacent LEDs in the array. I Referring to FIGS. 1-4, encapsulating the Flip Chip (FC), the insulating layer 65, the conductor layer 70 and the base substrate 50 is a transparent layer 70. The transparent layer 70 provides an element of protection for the chip scale package (CSP) light emitting diodes (LEDs) 50, as well as functioning for light diffusion to avoid light spotting of the light being emitted by the individually affixed chip scale package (CSP) light emitting diodes (LEDs) 50.

In some embodiments, the base substrate 60 can act as a frame and provides for structural stability of the filament structure 100. In some examples, the base substrate 60 is composed of a dielectric or metal. Examples of dielectrics can include alumina (e.g., sapphire) or other ceramics. However, it is preferred that the composition of the base substrate 60 be selected so that it does not transmit light. Examples of metals suitable for the base substrate 60 can include stainless steel, copper, brass, aluminum, aluminum alloy, tungsten and combinations thereof. It is noted that the above provided dielectric and metal compositions are provided for illustrative purposes only. Other compositions are equally applicable for providing the material of the base substrate 60.

The atop the base substrate 60 is the insulating layer 65. The dielectric or metal composition of the base substrate 60 provides sufficient rigidity and does not transmit light therethrough. However, when the base substrate 60 is composed of an electrically conductive material, the insulating layer 65 can provide isolation between the electrically conductive material of the base substrate 60 and the Flip Chip (FC) light emitting diodes (LEDs) 50. In some examples, the insulating layer 65 is deposited atop the base substrate 60 prior to forming the printed circuit that provides electrical communication to the Flip Chip (FC) light emitting diodes (LEDs) 50. The insulating layer 65 may be any dielectric/insulating material used in electronics for electrical isolation purposes. For example, the insulating layer 65 can be composed of alumina ($Al_2O_3$), silicon oxide ($SiO_2$), silicon carbide, as well as other metal oxides and ceramics etc. The insulating layer 65 may also be composed of glass fiber and glass fiber/epoxy compositions similar to those employed in FR4 dielectric compositions used in printed circuit boards.

Any dielectric deposition method may be employed in forming the insulating layer. For example, the dielectric material may be deposited onto the base substrate 60 using dip coating, curtain coating, deposition from solution, brush coating, etc. In other examples, a chemical vapor deposition (CVD) process may be employed, such as metal organic chemical vapor deposition (MOCVD) or plasma enhanced chemical vapor deposition (PECVD). In even further embodiments, a physical vapor deposition (PVD) process may be employed, such as deposition via evaporation or deposition by sputtering. In some examples, the evaporation method may be by E-beam evaporation, ion assisted deposition (IAD), thermal evaporation, and combinations thereof. Sputtering methods can include magnetron sputtering, ion beam sputtering, pulsed laser deposition (PLD) and combinations thereof.

To provide the electrical communication to the later engaged Flip Chip (FC) light emitting diodes (LEDs), a printed circuit 54 is formed on the insulating layer 65. The printed circuit 54 includes electrical pathways that are in direct contact with the contacts to the later engaged Flip Chip (FC) light emitting diodes (LEDs) 50 and the later formed electrode layer (conductor layer 70). The printed circuit provides direct electrical communication between the Flip Chip (FC) light emitting diodes (LEDs) 50 and the conductor layer 70. As used herein, "direct electrical contact" denotes electrical communication across a physical electrically conductive medium. In the present case, the physical electrically conductive medium is provided by a metal track (or lead). The metal tracks (or leads) provide separate pathways to the anode and cathode contacts of the Flip Chip (FC) emitting diodes (LEDs) 50, and to the anode and cathode contacts provided by the conductor layer 70. The metal tracks (also referred to as metal lines or leads) can be formed using a printing method. For example, the metal tracks may be composed of copper, aluminum, tungsten or alloys and combinations thereof. The metal tracks that provide the printed circuit 54 may be formed using printing technology, such as fused deposition modeling (FDM), selective laser sintering (SLS), stereo lithography apparatus (SLA), and combinations thereof.

In some embodiments, the tracks for the printed circuit 54 can lead to pads 51. The pads 51 are the points at which there is direct electrical contact between the printed circuit and the Flip Chip (FC) light emitting diodes (LEDs) 50.

As noted, the Flip Chip (FC) light emitting diodes (LEDs) 50 are engaged to circuit 54. As used herein, "light emitting diode (LED)" and "light emitting semiconductor structure" refer to a stack of semiconductor layers, including an active region which emits light when biased to produce an electrical current flow through the device, and contacts attached to the stack. If a substrate on which the semiconductor layers are grown is present, the "LED" includes the substrate. The active region of the LED can include an n-type region and a p-type region, which can be multiple layer structures of materials having the general formula $Al_xGa_yIn_{1-x-y}N$ ($0 \leq x \leq 1, 0 y 1, 0 x + y \leq 1$), and may further contain group III elements such as boron and thallium. Sometimes, the nitrogen may be replaced by phosphorus, arsenic, antimony, or bismuth. In some embodiments, the n-type region and the p-type region may be composed of a II-VI material. The LED 50 may emit blue light.

In some embodiments, the LEDs 50 are Flip Chip (FC) light emitting diodes (LEDs). A Flip Chip (FC) can be referred to as having a "wireless bonded chip architecture". A Flip Chip (FC) light emitting diode (LED) has an architecture that is distinguishable from a conventional wire bond LED package. The architecture of a conventional wire bond LED package has the active area of the semiconductor chip facing upwards as the chip is mounted onto the substrate or board with epoxy, usually with a dielectric layer in between. In a conventional wire bond LED package, wires are then used to interconnect bonding pads on the outer edges of the active area of the chip to the external circuitry of the substrate or board it is mounted on. These bonding pads are located on the outsides of the active area in order to minimize the amount of wiring needed to reach them. In this arrangement, light emits from the top of the chip and heat dissipates through the bottom.

Figure 5C:
FIG. 5C is a side view of a Flip Chip (FC) Light Emitting Diode (LED), in accordance with one embodiment of the present disclosure.
Figure 5A:
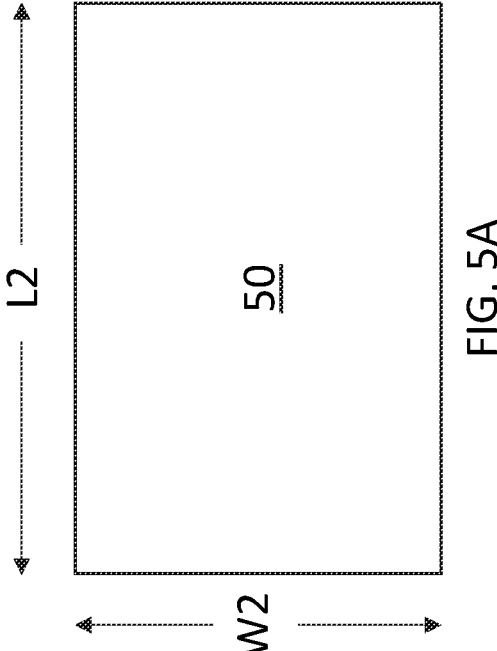
FIG. 5A is a top view of a Flip Chip (FC) Light Emitting Diode (LED), in accordance with one embodiment of the present disclosure.
Figure 5B:
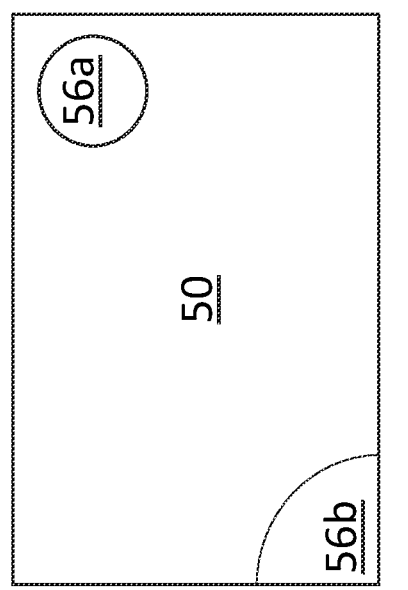
FIG. 5B is a bottom view of a Flip Chip (FC) Light Emitting Diode (LED), in accordance with one embodiment of the present disclosure.

In contrast to a wire bond LED, the wireless bonded architecture of a flip chip (FC) light emitting diode (LED) 50 flips the design upside down (literally) by rotating the orientation of the emissive elements of the chip, allowing an unobstructed path for light from the chip to the viewer. FIGS. 5A-5C illustrate one embodiment of a Flip Chip (FC) light emitting diode (LED) 50. FIG. 5A illustrates a top view, and FIG. 5C illustrates a side view. The bonding pads 56a, 56b for the Flip Chip (FC) light emitting diode (LED) 50 are depicted in FIG. 5B, which is a bottom view. The bonding pad identified by reference number 56b can be to the cathode of the light emitting diode (LED) 50. The boding pad identified by reference number 56a can be to the anode of the light emitting diode (LED) 50.

Though, ultimately a Flip Chip (FC) light emitting diode (LED) 50 delivers a more efficient product and requires fewer materials overall than a wire type connected diode, the design does include an additional step in manufacturing. Towards the end of the chip manufacturing process for the Flip Chip (FC) light emitting diode (LED) 50, the bonding pads 56a, 56b on the active surface of the chip receive a small dot of solder 57. Unlike with wire bonding, these pads do not necessarily need to be located on or near the outside edges of the surface since rather than connecting to external circuitry via wires looped around the other layers of the chip, they are simply attached to the circuitry, e.g., circuit 54 (such as printed circuit), directly through thermosonic bonding or reflow soldering. These bonds 57 leave a small sliver of space between the surface of the active area of the chip and the surface of the substrate or board. In some embodiments, the space can be filled with epoxy to act as a thermal bridge heat can use to escape.

The bonding pads 56a, 56b of the Flip Chip (FC) light emitting diode (LED) 50 can be engaged to the contact pads of the circuit 54. The connective means may be any conventional adhesive or metal bumps such as solder, gold, or aluminum, and is referred to as metal bumps (also referred to as solder bumps) 57. The term "solder", as used herein, refers to any metal or metallic compound or alloy that is melted and then allowed to cool in order to join two or more metallic surfaces together. Generally speaking, solders have melting temperatures in the range of 150° C. to 250° C. Solder bumps 57 may be small spheres of solder (solder balls) that are bonded to contact areas, interconnect lines or pads of the LEDs 50 and the printed circuit 54. In some embodiments, the solder bumps 57 can be made from lead-free solder mixtures or lead tin solder. In some examples, the Flip Chip (FC) light emitting diode (LED) 50 can then be picked and placed by either a high precision die bonder (with solder printed on substrate pads), or by a regular pick-place machine (also sometimes called a chip shooter).

Referring to FIGS. 5A-5C, the flip chip (FC) light emitting diode (LED) 50 can be very compact. For example, the flip chip (FC) light emitting diode (LED) 50 may have a width W2 and depth L2 dimension ranging on the order of 2 mm to 5 mm, and a thickness T1 ranging from 0.25 mm to 1.0 mm. In one example, the flip chip (FC) light emitting diode (LED) 50 measures 2.4 mm (W2)×2.4 mm (L2)×0.6 mm (T1).

The number of flip chip (FC) light emitting diode (LED) 50 that are engaged to the filament structure can be dependent upon application, and the size of the filament structures, as well as the light requirements for the performance of the filament light emitting diodes (LEDs). Although the example depicted in FIGS. 3 and 4 includes sixteen (16) flip chip (FC) light emitting diode (LED) 50, the present disclosure is not limited to only this example. For example, the number of flip chip (FC) light emitting diode (LED) 50 in a single LED filament may range from 10 LEDs to 40 LEDs. In one example, the number the number of flip chip (FC) light emitting diode (LED) 50 in a single LED filament may be equal to 28 LEDs.

Referring to FIGS. 1-4, a continuous phosphor layer 53 is present overlying the plurality of light emitting diode (LED) chips 50 (e.g., Flip Chip (FC) Light Emitting Diodes (LEDs). "Phosphor" refers to any luminescent materials which absorb light of one wavelength and emits light of a different wavelength, and "light emitting device" refers to an LED chip coated with a layer, for example a phosphor layer, through which the emitted light passes. The phosphor coating 53 converts the blue light to a suitable white light to be emitted by a lamp.

The phosphor coating 53 provides a method for providing white light from blue light emitted by light emitting diode chip (LED) 50. The phosphor white method produces white light in a single LED by combining a short wavelength LED such as blue or UV, and a yellow phosphor coating. The blue or UV photons generated in the LED either travels through the phosphor layer without alteration, or they are converted into yellow photons in the phosphor layer. The combinations of the blue and yellow photons combine to generate white light. Phosphor white may have a color rendering ranging from Ra 70 to 85.

In some embodiments, the LED 50 of the present disclosure may use a 450 nm-470 nm blue GaN (gallium nitride) LED or a 385 nm to 480 blue LED covered by a yellowish phosphor coating 53 usually made of cerium doped yttrium aluminium garnet (YAG:Ce) crystals which have been powdered and bound in a type of viscous adhesive. The LED chip emits blue light, part of which is converted to yellow by the YAG:Ce.

It is noted that gallium nitride (GaN) is only one example of the composition that may be employed for the LED 50. Other compositions are equally applicable so long as the light emitted by the selected composition can be converted to white light when passing through the phosphor coating 53. For example, in some embodiments, the composition of the LED 50 can be indium gallium nitride (InGaN). A common yellow phosphor material composition is cerium-doped yttrium aluminium garnet (Ce3+:YAG).

The methods and structures of the present disclosure provide sufficient phosphor to convert the blue light emitted from the flip chip LED 50 to white light. However, the amount of phosphor is minimized to avoid the filament having a highly observable yellow color. For example, the phosphor coating may be present in limited thicknesses ranging from 150 microns to 500 microns. In one example, the phosphor layer 53 has a thickness of 300 microns. The thickness of the phosphor layer may be equal to 100 microns, 150 microns, 200 microns, 250 microns, 300 microns, 350 microns, 400 microns, 450 microns or 500 microns. It is noted that the thickness of the phosphor layer 53 can have any range of values employing any of the values from the prior sentence as a minimum value for the range and any of the values from the prior sentence as a maximum for the range. Further, the phosphor may be disposed on only the array of LEDs 50 (also referred to as an island of LEDs), and only on the side of the substrate 60 that the LEDs 50 are present on. This is distinguished from prior filament designs that encapsulate the entire array of LEDs together with the entirety of the length of the substrate that the LEDs are present on. In prior designs, the phosphor encapsulant is a blanket deposited layer covering a majority of the filament structure, e.g., on both sides of the substrate 60, which includes the side of the substrate that does not include the LEDs 50. Contrary to blanket deposited phosphor of prior designs, for the phosphor layer 53 employed in the designs depicted in FIGS. 1-4, the phosphor is only formed on the portion of the filament that the flip chip light emitting diodes (LED) chips 50 of the present disclosure.

When describing the phosphor layer 53, the term "continuous" means that there are no breaks or cuts or openings in the phosphor layer across the island of LEDs 50 that the phosphor layer 53 is covering. Referring to FIG. 2, in some embodiments, the continuous phosphor layer 53 includes first portions F1 that are in direct contact with at least a light transmission surface (e.g., top surface) of the light emitting diode (LED) chips 50, and second portions F2 that bridge across the space separating adjacently positioned light emitting diodes 50. In some embodiments, the phosphor 53 may fill the space between the adjacently positioned light emitting diodes 50. However, in some embodiments, the phosphor layer 53 bridges entirely over the space between the adjacent LEDs 50 leaving an air gap encapsulated therein.

Referring to FIGS. 1 and 2, the continuous phosphor layer 53 may be present on the end sidewalls S1 of the light emitting diodes 50 at the edges of the array. Referring to FIG. 3, continuous phosphor layer 53 can also be present on an exterior sidewall S2 of the Flip Chip (FC) light emitting diodes (LEDs) 50.

The phosphor layer 53 can be deposited onto the array of LEDs 50 after they are bonded into electrical communication with the circuit 54, e.g., by solder bonding, as per flip chip methods. In some embodiments, to form the yellow phosphor material, a solid state reaction is employed that can employ sol-gel and (co) precipitation methods.

In some embodiments, the phosphor layer 53 is formed on the LED 50 by mixing a phosphor containing composition with a liquid or gel binder, such as epoxy or silicone, which is then applied as a layer to the array of LED chips 50 using paint, or brush application. In some embodiments, a coating process may be employed, such as a spray application or ink jet application. In yet other embodiments, the phosphor layer 53 can be applied to the array of LEDs 50 by mixing it with a liquid or gel binder, such as epoxy or silicone, which is then applied as a layer to the LED chips 50 by transfer and press.

In some embodiments, the phosphor layer 53 may be a conformal thickness coating. The term "conformal" denotes a layer having a thickness that does not deviate from greater than or less than 30% of an average value for the thickness of the layer. This denotes a range of thickness for the conformal layer having a lower value that is 30% less than the average value for the thickness of the conformal layer to an upper value that is 30% greater than the average value for the thickness of the conformal layer. In some examples, the thickness of the phosphor 53 may range from 150 microns to 500 microns. In one example, the thickness of the phosphor 53 is on the order of 300 microns.

Referring to FIGS. 1-4, the conductor layer 70 may be formed in direct electrical contact with the circuit 54 that brings electrical communication with the Flip Chip (FC) light emitting diode (LED) 50. The conductor layer 70 that is formed on opposing sides of the filament structure can provide the cathode and anode connections for the device. The conductor layer 70 may be formed atop the insulating layer 65. The conductor layer 70 may be formed using plating, electroplating, electroless plating etc. The conductor layer 70 may also be formed using printed technology similar to that described above for forming the circuit 54.

In some embodiments, the Flip Chip (FC) LED arrays are then coated with a clear transparent or translucent material having a very high transmittance with no phosphor. In some embodiments, white diffusive powder may be added into the adhesive, and the material can be translucent. This embodiment reduce the use of phosphor layers. By eliminating the encapsulating phosphor, the yellow coloring that is necessarily associated with phosphor is also eliminated from the design.

Still referring to FIGS. 1-4, the entirety of the structure, i.e., the continuous phosphor layer 53, the flip chip (FC) light emitting diode (LED) 50, the circuit 54, the insulating layer 65, the conductor layer 70 and the substrate 60 may be encapsulated in a transparent layer 75. The transparent layer 75 may be composed of polymeric material, such as silicon glue, epoxy resin, polycarbonate, acrylic and combinations thereof. In some embodiments, the assembly of the continuous phosphor layer 53, the flip chip (FC) light emitting diode (LED) 50, the circuit 54, the insulating layer 65, the conductor layer 70 and the substrate 60 are placed within a mold, and then the polymeric material that provides the composition of the transparent layer 75 is then injected into the mold around the entirety of the structure including the flip chip (FC) light emitting diode (LED) 50. The ends of the structure provided by the ends of the conductor layer 70 are not coated and provide the electrical connections, e.g., anode and cathode, to the filament structure.

The transparent layer 75 can provide both additional structure support for engaging the flip chip (FC) light emitting diodes (LEDs) 50 to the filament structure, and can also provide protection to the flip chip (FC) light emitting diodes (LEDs) 50. Additionally, the transparent layer 75 can also diffuse light that is being emitted by the flip chip (FC) light emitting diodes (LEDs) 50. By diffusing the light emitted by the flip chip (FC) light emitting diodes (LEDs) 50, light spotting is reduced. In some embodiments, the transparent layer 75 may be omitted.

In some embodiments, a method for assembling a filament light emitting diode 100 is provided that includes forming a circuit 54 on a filament stent substrate 60. In some examples, the circuit 54 has pads arranged along a length of the filament stent substrate 60. In some embodiments, the method includes bonding light emitting diode (LED) chips 50 to the circuit, the light emitting diode chips 50 including a light emitting diode (LED) die having contacts 56a, 56b on a contact surface side of the LED chips 50 for the bonding to the pads of the printed circuit 54. The bonding of the light emitting diode (LED) 50 to the circuit 54 can include solder bonding.

The method can further include forming a continuous phosphor layer 53 on the plurality of light emitting diodes. The phosphor layer 53 can include includes first portions F1 of the continuous phosphor layer 53 that are in direct contact with at least a light transmission surface of the light emitting diode (LED) chips 50, and second portions F2 of the continuous phosphor layer 53 that bridge across the space separating adjacently positioned light emitting diodes 50. The light transmission surface may be the surface of the LED 50 that is opposite the surface of the LED that is bonded to the circuit 54 of the filament 100. The continuous phosphor layer 53 may have a conformal thickness. In some embodiments, the continuous phosphor layer 53 is only present on a side of the filament stent substrate that the Flip Chip (FC) Light Emitting Diodes (LEDs) are also present on. The phosphor layer 53 may have a composition including cerium doped yttrium aluminium garnet (YAG:Ce) crystals.

In some embodiments, after forming the conformal phosphor layer 53, a transparent encapsulant 75 is formed over at least the light emitting diodes (LED) 50. The transparent encapsulant 75 may be omitted.

The methods and systems described herein can provide a filament light emitting diode (LED) that can provide white light without employing phosphor is such a great extent that when the filament is emitting light it is noticeably yellow. By reducing the amount of phosphor in the filament, the structures and methods can provide a filament light emitting diode that can be integrated into a bulb design so that the bulb has the appearance of a tungsten bulb.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Spatially relative terms, such as "forward", "back", "left", "right", "clockwise", "counter clockwise", "beneath," "below," "lower," "above," "upper," and the like, can be used herein for ease of description to describe one element's or feature's relationship to another element(s) or feature(s) as illustrated in the FIGs. It will be understood that the spatially relative terms are intended to encompass different orientations of the device in use or operation in addition to the orientation depicted in the FIGs. The terms "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

Having described preferred embodiments of a LIGHT EMITTING DIODE FILAMENT INCLUDING FLIP CHIP LIGHT EMITTING DIODES TO REDUCE THE AMOUNT OF PHOSPHOR THAT IS INTEGRATED INTO THE FILAMENT, it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A light emitting diode (LED) structure comprising:
a stent substrate;
a circuit having a plurality of contact pads arranged along a length of the stent substrate;
a plurality of light emitting diode (LED) chips, wherein each light emitting diode chip in the plurality of chips is engaged to a set of contact pads along the length of the metal stent substrate;
a continuous phosphor layer overlying the plurality of light emitting diode (LED) chips, the continuous phosphor layer including first portions that are in direct contact with at least a light transmission surface of the light emitting diode (LED) chips and second portions that bridge across the space separating adjacently positioned light emitting diodes, wherein the space separating the adjacently positioned light emitting diodes includes an airgap having a width extending between sidewalls of the adjacently positioned light emitting diodes, the airgap having an upper surface defined by a lower surface of the second portions of the continuous phosphor layer that bridge across the space separating the adjacently positioned light emitting diodes; and
an encapsulant present over the continuous phosphor layer that is covering at least the light emitting diode chips.

2. The light emitting diode (LED) structure of claim 1, wherein the plurality of light emitting diode (LED) chips comprise Flip Chip (FC) light emitting diodes (LEDS).

3. The light emitting diode (LED) structure of claim 1, wherein the encapsulant is transparent or translucent.

4. The light emitting diode structure of claim 1, wherein a length for the LED filament ranges from 3 mm to 30 mm, and a width for the LED filament ranges from 0.3 mm to 2.0 mm.

5. The light emitting diode structure of claim 1, wherein the light transmission surface that is in contact with the first portions of the continuous phosphor layer is an upper surface of the light emitting diode chip that is opposite a surface of the light emitting diode chip that is bonded to the stent substrate.

6. The light emitting diode structure of claim 1, wherein said each light emitting diode chip in the plurality of chips is engaged to the set of contact pads by solder bond.

7. The light emitting diode structure of claim 1, wherein a thickness for the continuous phosphor layer ranges from 150 microns to 500 microns.

8. The light emitting diode structure of claim 1, wherein the continuous phosphor layer is only present on a side of the stent substrate that the Light Emitting Diodes (LEDs) are also present on.

9. A light emitting filament structure comprising:
a filament substrate;
a plurality of flip chip light emitting diode (LED) chips; and
a continuous phosphor layer overlying the plurality of the flip chip light emitting diode (LED) chips, the continuous phosphor layer includes first portions that are in direct contact with at least a light transmission surface on an upper surface of the flip chip light emitting diode (LED) chips, and second portions that bridge across the space separating adjacently positioned light emitting diodes of the plurality of flip chip light emitting diode (LED) chips, the space separating the adjacently positioned light emitting diodes has a width extending between exposed sidewalls of the adjacently positioned light emitting diodes, the exposed sidewalls of the adjacently positioned light emitting diodes are not in contact with the continuous phosphor layer, wherein the space separating the adjacently positioned light emitting diodes has an upper surface defined by a lower surface of the second portions of the continuous phosphor layer.

10. The light emitting filament structure of claim 9, wherein the filament substrate is comprised of a dielectric material or a metal selected from the group consisting of stainless steel, copper, brass, aluminum, aluminum alloy, tungsten and combinations thereof.

11. The light emitting filament structure of claim 9, further comprising an encapsulant on the continuous phosphor layer, wherein the encapsulant is transparent or translucent.

12. The light emitting filament diode structure of claim 9, wherein the plurality of flip chip light emitting diodes (LED) chips use a 385 nm to 480 nm light emitting semiconductor material structure.

13. The light emitting filament structure of claim 9, wherein the plurality of the flip chip light emitting diode (LED) chips comprise GaN (gallium nitride) light emitting diodes, indium gallium nitride (InGaN) light emitting diodes or a combination thereof.

14. The light emitting filament structure of claim 9, wherein the continuous phosphor layer has a composition including cerium doped yttrium aluminium garnet (YAG: Ce) crystals.

15. The light emitting filament structure of claim 9, wherein the continuous phosphor layer is only present on a side of the filament substrate that the plurality of flip chip light emitting diode (LED) chips are also present on.

16. A method of assembling a filament light emitting diode comprising:

forming a circuit on a filament stent substrate, wherein the circuit having pads arranged along of length of the filament stent substrate;

bonding light emitting diode (LED) chips to the circuit, the light emitting diode chips including a light emitting diode (LED) die having contacts on a contact surface side of the LED chips for the bonding to the pads of the circuit; and forming a continuous phosphor layer on the plurality of light emitting diodes, the phosphor layer includes first portions of the continuous phosphor layer that are in direct contact with at least a light transmission surface of the light emitting diode (LED) chips, and second portions of the continuous phosphor layer that bridge across the space separating adjacently positioned light emitting diodes, the second portions of the continuous phosphor layer encapsulating an air gap between the adjacently positioned light emitting diodes.

17. The method of claim 16, wherein the continuous phosphor layer is only present on a side of the filament stent substrate that the light emitting diode (LED) chips are also present on.

18. The method of claim 16 further comprising forming a transparent encapsulant over at least the light emitting diode (LED) die.

19. The method of claim 16, wherein the bonding of the light emitting diode (LED) chips to the circuit comprises solder bonding.

20. The method of claim 16, wherein the continuous phosphor layer has a composition including cerium doped yttrium aluminium garnet (YAG:Ce) crystals.

* * * * *